(12) United States Patent
Needham

(10) Patent No.: US 6,542,612 B1
(45) Date of Patent: Apr. 1, 2003

(54) COMPANDING AMPLIFIER WITH SIDECHANNEL GAIN CONTROL

(76) Inventor: Alan W. Needham, 3352 Majestic Ct., Rocklin, CA (US) 95756

( * ) Notice: Subject to any disclaimer, the term of this patent is extended or adjusted under 35 U.S.C. 154(b) by 0 days.

(21) Appl. No.: 09/976,781

(22) Filed: Oct. 12, 2001

Related U.S. Application Data

(63) Continuation of application No. 08/943,397, filed on Oct. 3, 1997, now abandoned.

(51) Int. Cl.[7] .............................. H03G 7/00; H03G 3/00; H04B 1/64
(52) U.S. Cl. ..................... 381/106; 381/107; 381/108; 333/14
(58) Field of Search ...................... 381/106, 107–108, 381/114, 2; 333/14; 704/503, 500, 200.1, 224–225

(56) References Cited

U.S. PATENT DOCUMENTS

| | | | |
|---|---|---|---|
| 4,809,274 A | * | 2/1989 | Walker et al. .................. 380/28 |
| 4,843,261 A | | 6/1989 | Potratz |
| 4,843,621 A | * | 6/1989 | Potratz .......................... 379/58 |
| 5,185,809 A | | 2/1993 | Dolby et al. |
| 5,473,279 A | | 12/1995 | D'Angelo et al. |
| 5,510,752 A | * | 4/1996 | Gagon .......................... 381/106 |
| 5,666,424 A | | 9/1997 | Fosgate et al. |
| 5,907,827 A | * | 5/1999 | Fang et al. ..................... 381/81 |

OTHER PUBLICATIONS

Ash, John et al., "DSP Voice Frequency Compander," Screen Shots, http://www.wwc.edu/–frohro/qex–art.html; previously published in QEX, Jul. (1994), pp. 1 thru 9.

* cited by examiner

Primary Examiner—Minsun OH Harvey
Assistant Examiner—Laura A. Grier
(74) Attorney, Agent, or Firm—John P. O'Banion

(57) ABSTRACT

A companding amplifier wherein compression data is provided to an expansion circuit along with audio data. An analog audio input signal is compressed and converted into digital data by a compression circuit. The compression circuit includes a data framer that produces a digital data stream that contains both the digital audio data and digital compression data. The resultant digital data stream can then be recorded on a medium such as a CD or DAT, or transmitted over a medium such as wire, fiber optic or radio waves. The digital data stream can then be read back or otherwise received by an expansion circuit that includes a data separator that separates the digital audio data and digital compression data. The digital audio data is then converted back to an analog audio signal, and the digital compression data is converted to an analog control signal that is used as the control signal for expansion.

13 Claims, 6 Drawing Sheets

COMPANDING AMPLIFIER WITH SIDECHANNEL GAIN CONTROL

CROSS-REFERENCE TO RELATED APPLICATIONS

This application is a continuation of copending application Ser. No. 08/943,397 filed on Oct. 3, 1997, now abandoned.

STATEMENT REGARDING FEDERALLY SPONSORED RESEARCH OR DEVELOPMENT

Not Applicable

REFERENCE TO A COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office file or records, but otherwise reserves all copyright rights whatsoever.

BACKGROUND OF THE INVENTION

1. Field of the Invention

This invention pertains generally to companding amplifiers, and more particularly to a companding amplifier where expansion gain is digitally controlled over a sidechannel.

2. Description of the Background Art

Companding amplifiers are well known in the art, and an example of a conventional companding amplifier can be found in U.S. Pat. No. 5,473,279 which is incorporated herein by reference. Conventional companding amplifiers typically employ circuitry that compresses an audio input signal using a full wave rectifier and peak detector or their equivalent. An expanding amplifier then uses the peak to peak amplitude as a metric for the amount of expansion.

While conventional companding amplifiers are suitable for voice communication, the are not suitable for transmission of music. Due to the lag time of expansion, in conventional companding amplifiers you can hear the compression in the music before the expander has time to react. If the compression expander timing is shortened, the THD becomes unbearable. Accordingly, current companding amplifier technology does not effectively use the dynamic range of he communication channel. The expansion amount is determined by the level of the signal, and the full channel bandwidth cannot be used all of the time.

In addition, analog to digital converters used in conventional companding amplifiers have problems with the accommodation of small signals and very large signals. If the converter is set to accommodate large signals during loud passages of music, quiet passages presented to the converter may be lost in the noise floor of the converter. If the A/D converter is set for small signals, then clipping will occur during loud passages of music.

Therefore, there is a need for a companding amplifier that will effectively extend the dynamic range of analog to digital converters and provide for transmission of music.

The present invention satisfies those needs, as well as others, and overcomes the deficiencies found in companding amplifiers previously developed.

BRIEF SUMMARY OF THE INVENTION

The present invention comprises a companding amplifier wherein compression data is provided to an expander along with audio data. By way of example, and not of limitation, the invention includes a voltage controlled amplifier (compressor), a data framer, a data separator, a voltage controlled attenuator (expander), and both analog to digital and digital to analog converters. An audio input signal is compressed by the compressor and converted into digital data. Compression and data framing is controlled by a microprocessor that provides both compression signals to the voltage controlled amplifier and digital compression data to the data framer. The data framer produces a digital data stream that contains both the digital audio data and the digital compression data. The resultant digital data stream can then be recorded on a medium such as a CD or DAT, or transmitted over a medium such as wire, fiber optic or radio waves. Prior to expansion, the data separator separates the digital audio data and digital compression data. The digital audio data is then converted back to an analog audio signal and presented to the voltage controlled attenuator, and the digital compression data is converted to an analog control signal and used as the control signal for the voltage controlled attenuator amplifier. The "sidechannel" control of the expansion circuit with separate gain data results in an increase in dynamic range.

An object of the invention is to increase the dynamic range of a companding amplifier.

Another object of the invention is to separate gain data from audio data in a companding amplifier.

Another object of the invention to present gain data to an expander that is separate from the audio data.

Another object of the invention is to send digital gain data with digital audio data for reconstruction of a compressed audio signal by an expander.

Another object of the invention is to send gain data to an expander for control expansion level.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Figure 1:
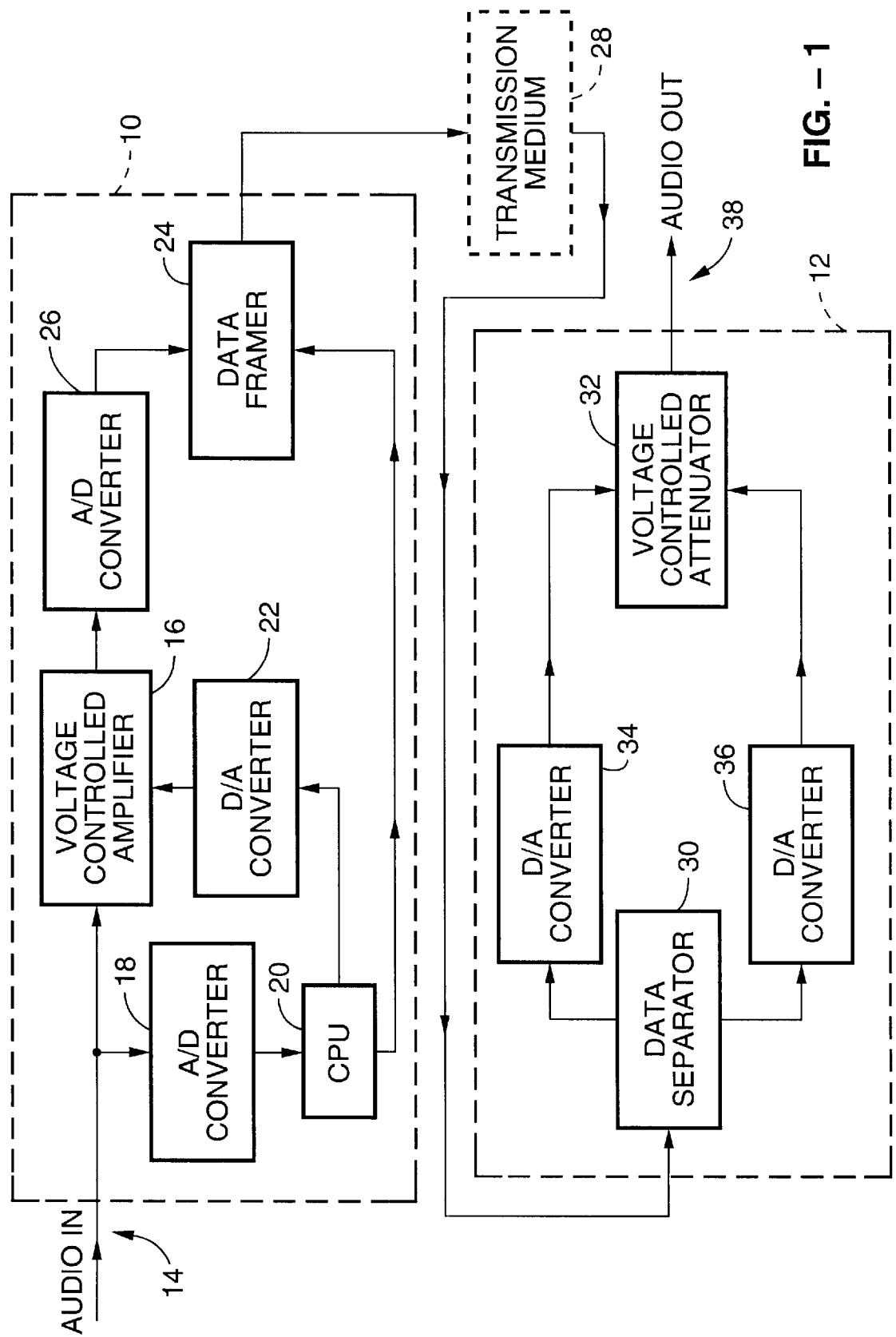
FIG. 1 is functional block diagram of a companding amplifier with sidechannel gain control in accordance with the present invention.
Figure 2:
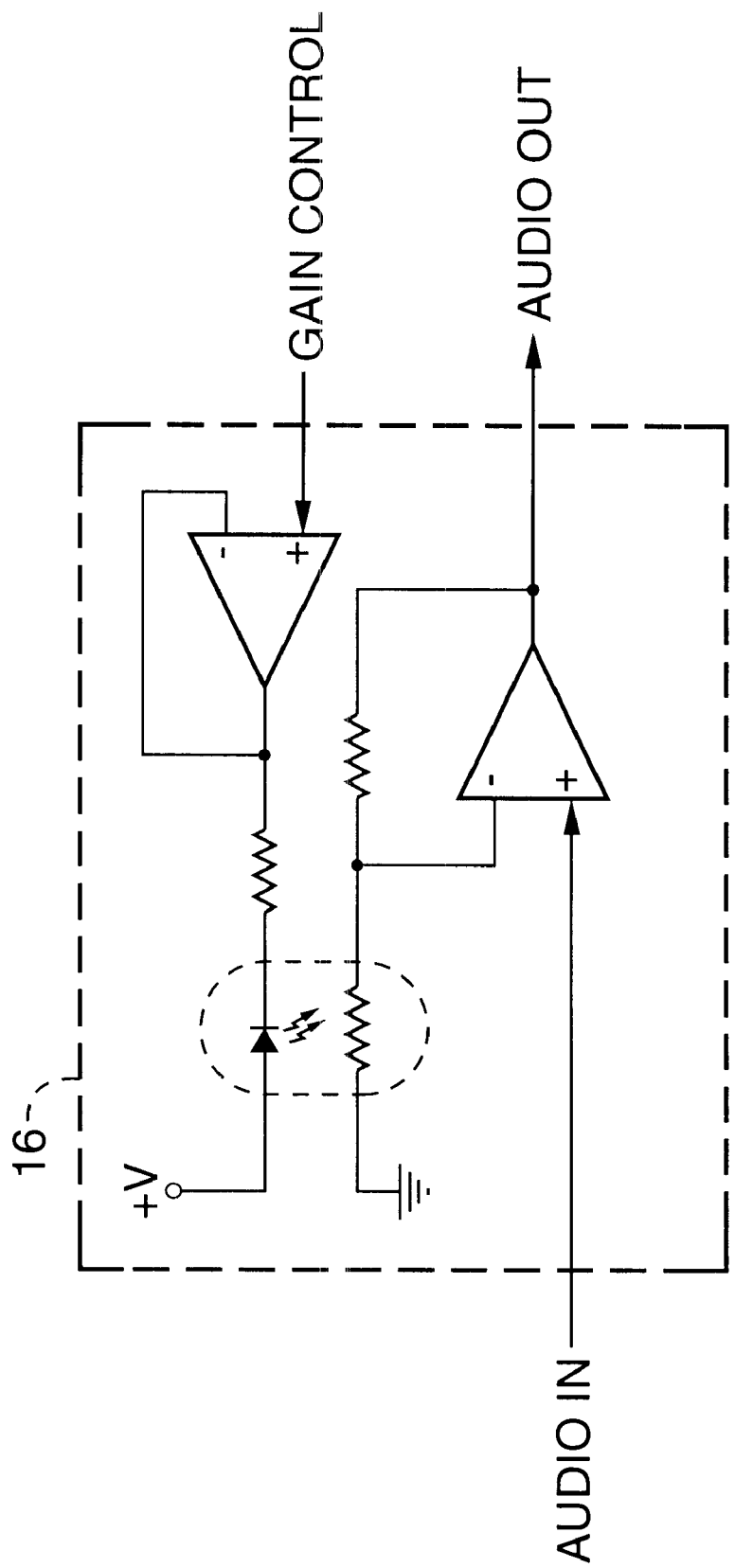
FIG. 2 is a functional block diagram of an embodiment of the voltage controlled amplifier shown in FIG. 1.
Figure 3:
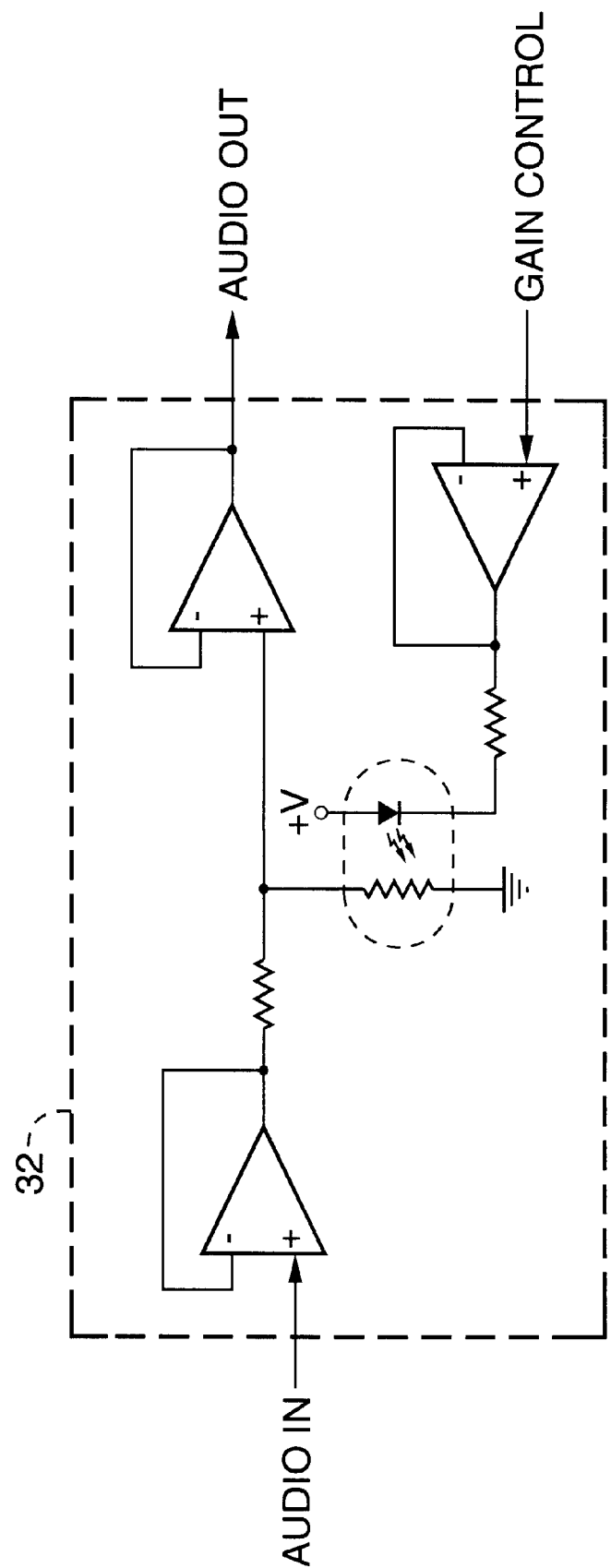
FIG. 3 is a functional block diagram of an embodiment of the voltage controlled attenuator shown in FIG. 1.

Referring more specifically to the drawings, for illustrative purposes the present invention is embodied in the apparatus generally shown in FIG. 1 through FIG. 3 and the method generally shown in FIG. 3 through FIG. 6, where like reference numerals denote like elements and steps. It will be appreciated that the apparatus may vary as to configuration and as to details of the parts and that the method may vary as to the steps and their sequence without departing from the basic concepts as disclosed herein.

Referring first to FIG. 1 through FIG. 3, a companding amplifier in accordance with the present invention comprises compression circuitry 10 and expansion circuitry 12 as generally shown. An analog audio signal 14 that is compressed by compression circuitry 10 is received at the input of a analog voltage controlled amplifier 16 which functions as a compressor, and at the input of an analog to digital (A/D) converter 18. A central processing unit (CPU) 20 processes digital data from the output of A/D converter 18 and generates a digital gain control signal for voltage controlled amplifier 16 that adjusts the gain of voltage controlled amplifier 16 so that the maximum dynamic range is used; that is, a small signal would require maximum gain while a large signal would require only minimum gain. This digital gain control signal is converted to an analog gain control signal for voltage controlled amplifier 16 by digital to analog (D/A) converter 22. In addition, CPU 20 generates digital compression (gain) data for data framer 24 and controls the framing of that data with the compressed audio signal from voltage controlled amplifier 16 after the compressed audio signal is converted to digital audio data by A/D converter 26. The output of data framer 24 is a digital data stream comprising the digital audio data and the compression data. Referring also to FIG. 2, voltage controlled amplifier 16 preferably comprises an optically controlled feedback amplifier as shown to reduce noise.

The digital data stream from data framer 24 is then processed by expansion circuitry 12 after being received by expansion circuitry 12 via a transmission medium 28. Transmission medium 28 may comprise many forms, including a radio frequency communications channel, optical communications channel, or a hardwired communications channel. Transmission medium 28 may also comprise a physical data carrier such as a compact disc (CD), digital audio tape (DAT), memory card or the like onto which the digital data stream has been recorded.

Expansion circuitry 12 includes a data separator 30 that separates the digital audio data from the digital compression data for expansion by a voltage controlled attenuator 32, which functions as an expander. The digital audio data is converted to an analog audio signal by D/A converter 34 and the digital compression data is converted to an analog control signal by D/A converter 36. Voltage controlled attenuator 32 then expands the analog audio signal using the analog control signal from D/A converter 36 and outputs a reconstructed audio signal 38. Referring also to FIG. 3, voltage controlled attenuator 32 preferably comprises an optically controlled feedback attenuator as shown to reduce noise.

Figure 4:
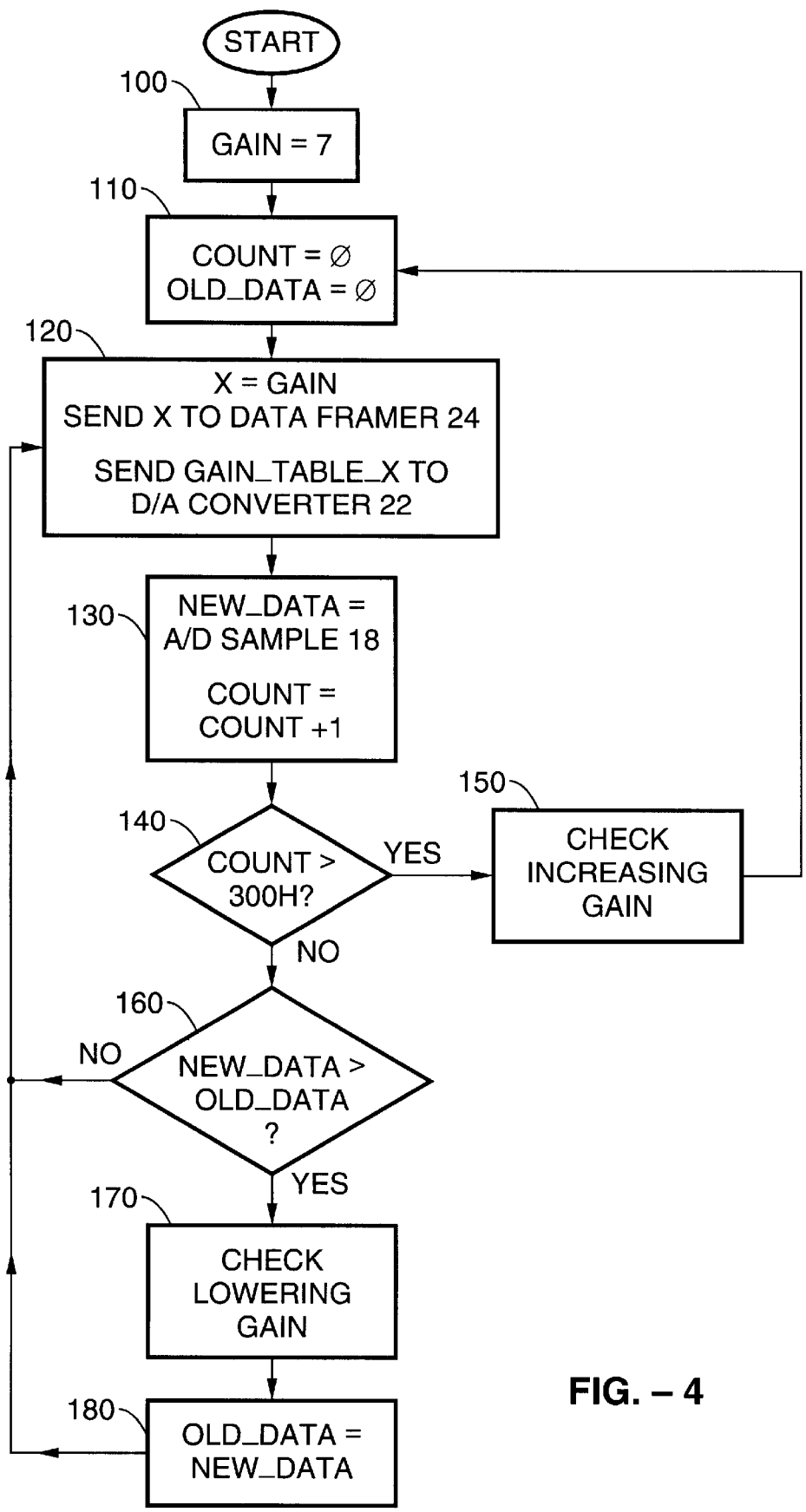
FIG. 4 is a flow chart showing the gain control method employed in the companding amplifier shown in FIG. 1.

Referring now to FIG. 4, CPU 20 controls the gain of voltage controlled amplifier 16 and generates the digital compression data for use by expansion circuitry 12 in the following manner. At step 100, the variable "gain" is set to an initial value of seven. At step 110, the variables "count" and "old_data" are each initialized to values of zero. At step 120, the variable "x" is set to the value of "gain", the value of "x" is sent to data framer 24, and the value of "gain_table_x" is sent to D/A converter 22. Typical values of "gain_table_x" for x=1 to 7 are shown in Table 1. Note that gain increases as the value of "gain_table_x" decreases.

At step 130, the variable "new_data" is assigned the value of the data sample from A/D converter 18, and the variable "count" is incremented by one. Next, at step 140 the value of "count" is tested against 300H. If "count" is greater than 300H, then the check increasing gain subroutine 150 is called. In this way, the gain can only be increased one step for every 301H data samples, thus providing a very slow decay rate. If "count" is not greater than 300H, at step 160 the value of "new_data" is tested against the value of "old_data" and, if "new_data" is greater than "old_data" the check lowering gain subroutine 170 is called. Thereafter, the value of "old_data" is set to the value of "new_data" at step 180. This allows for the gain to be decreased after each data sample to accommodate small to large signal changes and thus provide a fast attack rate. Otherwise, the routine returns to step 120.

Figure 5:
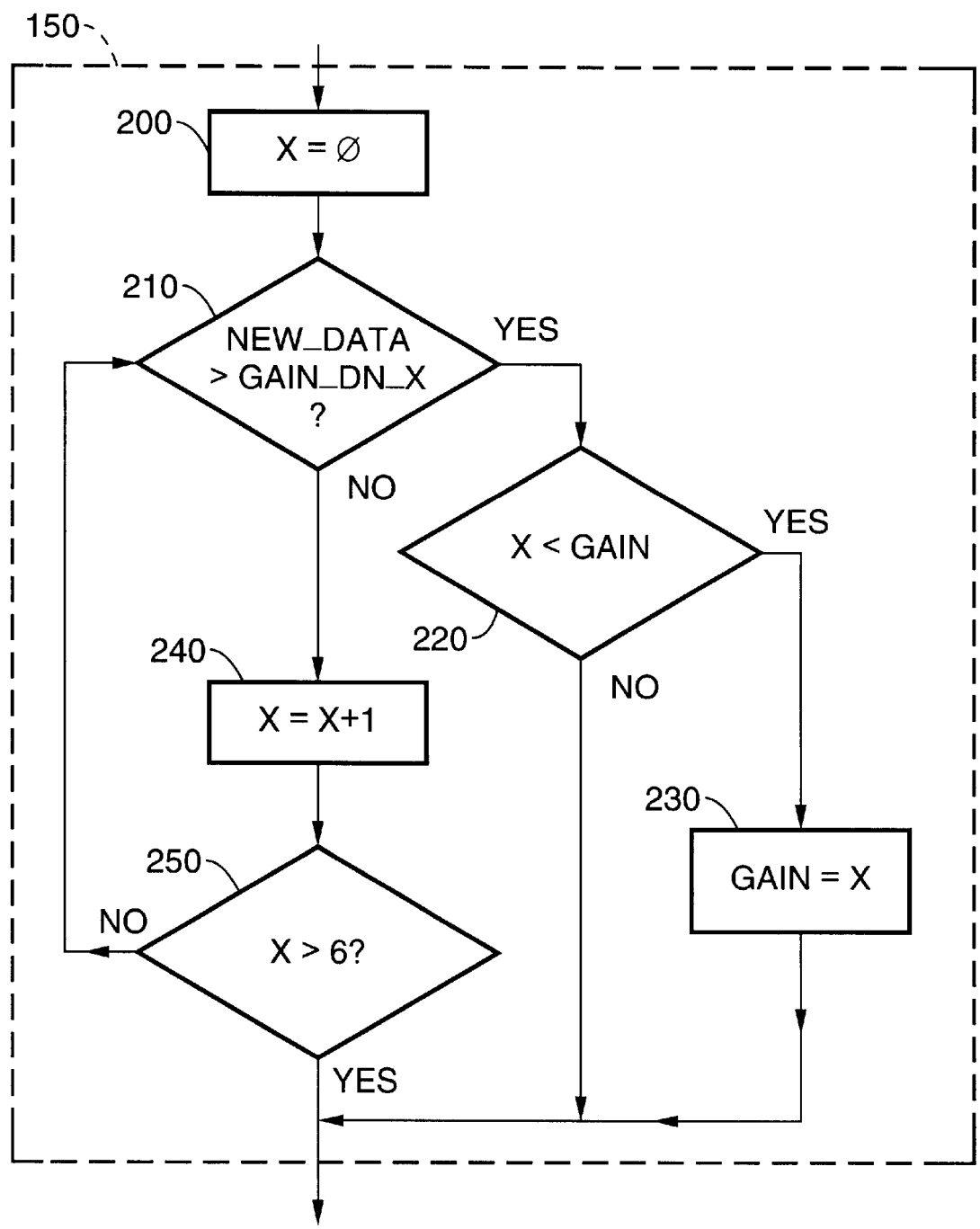
FIG. 5 is a flow chart showing the steps employed in the check lowering gain step shown in FIG. 4.

Referring also to FIG. 5, the check lowering gain subroutine 170 typically comprises the steps shown. At step 200, the variable "x" is initialized to a value of zero. Next, at step 210 the value of "new_data" is tested against the value of "gain_dn_x". Table 1 above shows typical values for the variable "gain_dn_x" for values of "x" from zero to six.

If "new_data" is greater than "gain_dn_x" the value of "x" is tested against the value of "gain" at step 220. If the value of "x" is less than the value of "gain" then "gain" is set to the value of "x" at step 230 and the subroutine returns to step 180. Otherwise, the subroutine bypasses step 230 and exits to step 180. If at step 210 the value of "new_data" is not greater than the value of "gain_dn_x" then "x" is incremented by one at step 240. Then at step 250 the value of "x" is tested to determine if it is greater than six and, if so, the routine exits to step 180. Otherwise, the routine returns to step 210.

Figure 6:
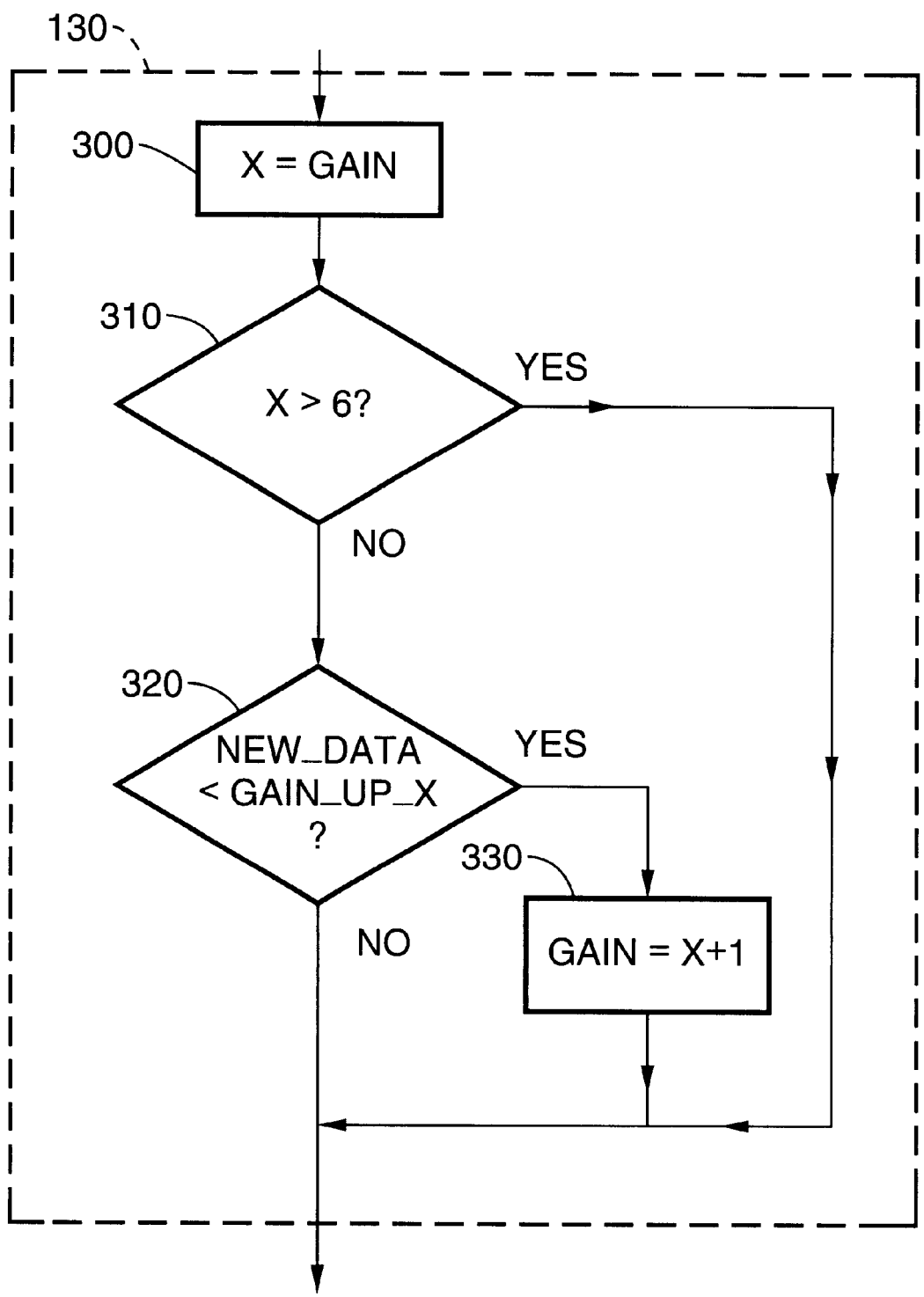
FIG. 6 is a flow chart showing the steps employed in the check increasing gain step shown in FIG. 4.

Referring also to FIG. 6, the check increasing gain subroutine 150 typically comprises the steps shown. At step 300 the value of "x" is set to the value of "gain". Next, at step 310 the value of "x" is tested to determine if it is greater than six and, if so, the subroutine exits to step 110. Otherwise, at step 320 the value of "new_data" is tested against the value of "gain_up_x". Table 1 above shows typical values of "gain_up_x" for values of "x" from zero to six. If "new_data" is less than "gain_up_x described are conventional and, therefore, their details are not described herein. It will then the value of "gain" is incremented by one at step 330 and the subroutine exits to step 110. Otherwise, step 330 is bypassed and the subroutine exits to step 110.

Those skilled in the art will appreciate that all of the circuit elements thus also be appreciated that the input signals to the analog to digital converters could be conditioned using conventional buffers if desired. In addition, it will be appreciated that the digital data stream from data framer 24 could include additional data, such as battery information in self-powered units, in which case a CPU could be included between data separator 30 and D/A converter 36 to strip out the additional data from the digital compression data. Further, it will be appreciated that digital and analog equivalents of circuit elements could be employed, as well as discrete and integrated equivalents.

Accordingly, it will be seen that this invention provides a digital companding amplifier with sidechannel gain control that extends the dynamic range of analog to digital converters. Although the description above contains many specificities, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A digital companding amplifier, comprising:
   (a) audio compression circuitry to compress an analog audio input signal, said audio compression circuitry including means for outputting digital audio data and digital compression data associated with said digital audio data; and
   (b) audio expansion circuitry to convert said digital compressed audio data to an analog audio signal and to expand said analog audio signal as a function of said digital compression data;
   (c) wherein said audio compression circuitry comprises:
      (i) voltage controlled amplifier means for receiving an analog audio input signal, receiving an analog voltage control signal, and outputting a compressed analog audio signal;
      (ii) first analog to digital converter means for converting said compressed analog audio signal to compressed digital audio data;
      (iii) second analog to digital converter means for converting said analog audio input signal to digital audio data;
      (iv) control processor means for receiving said digital audio data from said second analog to digital converter means, outputting digital voltage control data, and outputting digital compression data;
      (v) first digital to analog converter means for converting said digital voltage control data from said control processor means to an analog voltage control signal and outputting said analog voltage control signal to said voltage controlled amplifier means; and
      (vi) data framer means for receiving said compressed digital audio data from said first analog to digital converter means and said digital compression data from said control processor means and outputting a framed data stream.

2. A digital companding amplifier as recited in claim 1, wherein said audio expansion circuitry comprises means for separating said framed digital data stream into said digital audio data and said digital compression data, converting said digital audio data into an analog audio signal, and expanding said analog audio signal as a function of said digital compression data.

3. A digital companding amplifier as recited in claim 1, wherein said audio expansion circuitry comprises:
   (a) data separator means for receiving said framed data stream and outputting said compressed digital audio data and said digital compression data;
   (b) second digital to analog converter means for converting said compressed digital audio data from said data separator means to a compressed analog audio signal;
   (c) third digital to analog converter means for receiving said digital voltage control data from said data separator means and outputting an analog voltage control signal; and
   (d) voltage controlled attenuator means for receiving said compressed analog audio signal from said second digital to analog converter means, for receiving said analog voltage control signal from said third digital to analog converter means, and outputting an expanded analog audio signal.

4. A digital companding amplifier, comprising:
   (a) compressing circuitry means for compressing an analog audio input signal, converting said compressed analog audio input signal to digital audio data, generating digital compression data associated with said compressed analog audio input signal, and framing said digital audio data and said digital compression data into a digital data stream; and
   (b) expanding circuitry means for separating said framed digital data stream into said digital audio data and said digital compression data, converting said digital audio data into an analog audio signal, and expanding said analog audio signal as a function of said digital compression data;
   (c) wherein said compressing circuitry means comprises:
      (i) voltage controlled amplifier means for receiving an analog audio input signal, receiving an analog voltage control signal, and outputting a compressed analog audio signal;
      (ii) first analog to digital converter means for converting said compressed analog audio signal to compressed digital audio data;
      (iii) second analog to digital converter means for converting said analog audio input signal to digital audio data;
      (iv) control processor means for receiving said digital audio data from said second analog to digital converter means, outputting digital voltage control data, and outputting digital compression data;
      (v) first digital to analog converter means for converting said digital voltage control data from said control processor means to an analog voltage control signal and outputting said analog voltage control signal to said voltage controlled amplifier means; and
      (vi) data framer means for receiving said compressed digital audio data from said first analog to digital converter means and said digital compression data from said control processor means and outputting a framed data stream.

5. A digital companding amplifier as recited in claim 4, wherein said expanding circuitry means comprises:
   (a) data separator means for receiving said framed data stream and outputting said compressed digital audio data and said digital compression data;
   (b) second digital to analog converter means for converting said compressed digital audio data from said data separator means to a compressed analog audio signal;

(c) third digital to analog converter means for receiving said digital voltage control data from said data separator means and outputting an analog voltage control signal; and (d) voltage controlled attenuator means for receiving said compressed analog audio signal from said second digital to analog converter means, for receiving said analog voltage control signal from said third digital to analog converter means, and outputting an expanded analog audio signal.

6. A digital companding amplifier, comprising:

(a) voltage controlled amplifier means for receiving an analog audio input signal, receiving an analog voltage control signal, and outputting a compressed analog audio signal;

(b) first analog to digital converter means for converting said compressed analog audio signal to compressed digital audio data;

(c) second analog to digital converter means for converting said analog audio input signal to digital audio data;

(d) control processor means for receiving said digital audio data from said second analog to digital converter means, outputting digital voltage control data, and outputting digital compression data;

(e) first digital to analog converter means for converting said digital voltage control data from said control processor means to an analog voltage control signal and outputting said analog voltage control signal to said voltage controlled amplifier means;

(f) data framer means for receiving said compressed digital audio data from said first analog to digital converter means and said digital compression data from said control processor means and outputting a framed data stream;

(g) data separator means for receiving said framed data stream and outputting said compressed digital audio data and said digital compression data;

(h) second digital to analog converter means for converting said compressed digital audio data from said data separator means to a compressed analog audio signal;

(i) third digital to analog converter means for receiving said digital voltage control data from said data separator means and outputting an analog voltage control signal; and (j) voltage controlled attenuator means for receiving said compressed analog audio signal from said second digital to analog converter means, for receiving said analog voltage control signal from said third digital to analog converter means, and outputting an expanded analog audio signal.

7. A digital companding amplifier, comprising:

an audio compression circuit;

said audio compression circuit configured to compress an analog audio input signal;

said audio compression circuit configured to output digital audio data and digital compression data associated with said digital audio data; and an audio expansion circuit;

said audio expansion circuit configured to convert said digital compressed audio data to an analog audio signal;

said audio expansion circuit configured to expand said analog audio signal as a function of said digital compression data;

wherein said audio compression circuit comprises:
  a voltage controlled amplifier;
    said voltage controlled amplifier configured to receive an analog audio input signal;
    said voltage controlled amplifier configured to receive an analog voltage control signal;
    said voltage controlled amplifier configured to output a compressed analog audio signal;
  a first analog to digital converter;
    said first analog to digital converter configured to convert said compressed analog audio signal to compressed digital audio data;
  a second analog to digital converter;
    said second analog to digital converter configured to convert said analog audio input signal to digital audio data;
  a control processor;
    said control processor configured to receive said digital audio data from said second analog to digital converter;
    said control processor configured to output digital voltage control data;
    said control processor configured to output digital compression data;
  a first digital to analog converter;
    said first digital to analog converter configured to convert said digital voltage control data from said control processor to an analog voltage control signal;
    said first digital to analog converter configured to output said analog voltage control signal to said voltage controlled amplifier; and
  a data framer;
    said data framer configured to receive said compressed digital audio data from said first analog to digital converter;
    said data framer configured to receive said digital compression data from said control processor;
    said data framer configured to output a framed data stream.

8. A digital companding amplifier as recited in claim 7, wherein said audio compression circuit is configured to:
  compress an analog audio input signal;
  convert said compressed analog audio input signal to digital audio data;
  generate digital compression data associated with said compressed analog audio input signal; and
  frame said digital audio data and said digital compression data into a digital data stream.

9. A digital companding amplifier as recited in claim 8, wherein said audio expansion circuit is configured to:
  separate said framed digital data stream into said digital audio data and said digital compression data;
  convert said digital audio data into an analog audio signal; and
  expand said analog audio signal as a function of said digital compression data.

10. A digital companding amplifier as recited in claim 7, wherein said audio expansion circuit comprises:
  a data separator;
    said data separator configured to receive said framed data stream;
    said data separator configured to output said compressed digital audio data;
    said data separator configured to output said digital compression data;

a second digital to analog converter;

said second digital to analog converter configured to convert said compressed digital audio data from said data separator to a compressed analog audio signal;

a third digital to analog converter;

said third digital to analog converter configured to receive said digital voltage control data from said data separator;

said third digital to analog converter configured to output an analog voltage control signal; and a voltage controlled attenuator;

said voltage controlled attenuator configured to receive said compressed analog audio signal from said second digital to analog converter;

said voltage controlled attenuator configured to receive said analog voltage control signal from said third digital to analog converter;

said voltage controlled attenuator configured to output an expanded analog audio signal.

11. A digital companding amplifier, comprising:

a compression circuit;

said compression circuit configured to compress an analog audio input signal;

said compression circuit configured to convert said compressed analog audio input signal to digital audio data;

said compression circuit configured to generate digital compression data associated with said compressed analog audio input signal;

said compression circuit configured to frame said digital audio data and said digital compression data into a digital data stream; and an expansion circuit;

said expansion circuit configured to separate said framed digital data stream into said digital audio data and said digital compression data;

said expansion circuit configured to convert said digital audio data into an analog audio signal;

said expansion circuit configured to expand said analog audio signal as a function of said digital compression data;

wherein said compression circuit comprises:

a voltage controlled amplifier;
said voltage controlled amplifier configured to receive an analog audio input signal;
said voltage controlled amplifier configured to receive an analog voltage control signal;
said voltage controlled amplifier configured to output a compressed analog audio signal;
a first analog to digital converter;
said first analog to digital converter configured to convert said compressed analog audio signal to compressed digital audio data;
a second analog to digital converter;
said second analog to digital converter configured to convert said analog audio input signal to digital audio data;
a control processor;
said control processor configured to receive said digital audio data from said second analog to digital converter;
said control processor configured to output digital voltage control data;
said control processor configured to output digital compression data;

a first digital to analog converter;
said first digital to analog converter configured to convert said digital voltage control data from said control processor to an analog voltage control signal;
said first digital to analog converter configured to output said analog voltage control signal to said voltage controlled amplifier; and a data framer;
said data framer configured to receive said compressed digital audio data from said first analog to digital converter;
said data framer configured to receive said digital compression data from said control processor;
said data framer configured to output a framed data stream.

12. A digital companding amplifier as recited in claim 11, wherein said expansion circuit comprises:

a data separator;

said data separator configured to receive said framed data stream;

said data separator configured to output said compressed digital audio data;

said data separator configured to output said digital compression data; a second digital to analog converter;

said second digital to analog converter configured to convert said compressed digital audio data from said data separator to a compressed analog audio signal;

a third digital to analog converter;

said third digital to analog converter configured to receive said digital voltage control data from said data separator;

said third digital to analog converter configured to output an analog voltage control signal; and a voltage controlled attenuator;

said voltage controlled attenuator configured to receive said compressed analog audio signal from said second digital to analog converter;

said voltage controlled attenuator configured to receive said analog voltage control signal from said third digital to analog converter;

said voltage controlled attenuator configured to output an expanded analog audio signal.

13. A digital companding amplifier, comprising:

a voltage controlled amplifier;

said voltage controlled amplifier configured to receive an analog audio input signal;

said voltage controlled amplifier configured to receive an analog voltage control signal;

said voltage controlled amplifier configured to output a compressed analog audio signal;

a first analog to digital converter;

said first analog to digital converter configured to convert said compressed analog audio signal to compressed digital audio data;

a second analog to digital converter;

said second analog to digital converter configured to convert said analog audio input signal to digital audio data;

a control processor;

said control processor configured to receive said digital audio data from said second analog to digital converter;

said control processor configured to output digital voltage control data;

said control processor configured to output digital compression data;

a first digital to analog converter;

said first digital to analog converter configured to convert said digital voltage control data from said control processor to an analog voltage control signal;

said first digital to analog converter configured to output said analog voltage control signal to said voltage controlled amplifier;

a data framer;

said data framer configured to receive said compressed digital audio data from said first analog to digital converter;

said data framer configured to receive said digital compression data from said control processor;

said data framer configured to output a framed data stream;

a data separator;

said data separator configured to receive said framed data stream;

said data separator configured to output said compressed digital audio data;

said data separator configured to output said digital compression data;

a second digital to analog converter;

said second digital to analog converter configured to convert said compressed digital audio data from said data separator to a compressed analog audio signal;

a third digital to analog converter;

said third digital to analog converter configured to receive said digital voltage control data from said data separator;

said third digital to analog converter configured to output an analog voltage control signal; and a voltage controlled attenuator;

said voltage controlled attenuator configured to receive said compressed analog audio signal from said second digital to analog converter;

said voltage controlled attenuator configured to receive said analog voltage control signal from said third digital to analog converter;

said voltage controlled attenuator configured to output an expanded analog audio signal.

* * * * *